United States Patent [19]

Houle et al.

[11] Patent Number: 5,668,983
[45] Date of Patent: Sep. 16, 1997

[54] PRECISE STOPPING OF A HIGH SPEED MICROPROCESSOR CLOCK

[75] Inventors: Robert Maurice Houle, Winooski; Kenneth Michael Zick, Essex, both of Vt.

[73] Assignee: International Business Machines Corporation, Armonk, N.Y.

[21] Appl. No.: 359,233

[22] Filed: Dec. 19, 1994

[51] Int. Cl.$^6$ ......................................................... G06F 1/04
[52] U.S. Cl. ............................................................ 395/560
[58] Field of Search .................................. 395/550, 555, 395/556, 559, 560

[56] References Cited

U.S. PATENT DOCUMENTS

| | | | |
|---|---|---|---|
| 4,161,787 | 7/1979 | Groves et al. | 364/DIG. 2 |
| 4,321,687 | 3/1982 | Parsons et al. | 364/DIG. 2 |
| 4,348,743 | 9/1982 | Dozier | 364/DIG. 2 |
| 5,153,848 | 10/1992 | Elkind et al. | 364/748 |
| 5,294,842 | 3/1994 | Iknaian et al. | 307/269 |
| 5,313,618 | 5/1994 | Pawloski | 395/500 |
| 5,422,835 | 6/1995 | Houle et al. | 364/703 |

OTHER PUBLICATIONS

"LSSD Single Latch Design Clock Interlock Circuit", J. Loffredo et al., IBM Tech. Dis. Bulletin, vol. 24, No. 4, Sep. 1981, pp. 2076–2077.

"Processor Control By Two Independent Phase-Locked Clocks", L. Fangmeier et al., IBM Tech. Dis. Bulletin, vol. 14, No. 11, Apr. 1972, pp. 3394–3395.

"Passing Data Stream Across Asynchronous Clock Domains in Scalable Coherent Interface Bus", R. Fuhs, et al., IBM Tech. Dis. Bulletin, vol. 36, No. 11, Nov. 1993, pp. 373–375.

"Method for Increasing the Accuracy of a Software Clock" R. Flyod et al., IBM Tech. Dis. Bulletin, vol. 29, No. 8 Jan. 1987, pp. 3374.

*Primary Examiner*—Thomas M. Heckler
*Attorney, Agent, or Firm*—Perman & Green, LLP

[57] ABSTRACT

A method and means for selectively stopping the internal clock of a microprocessor on any of 16 phases using functional components which include: a clock multiplier circuit, that receives a clock signal input from an external oscillator or other appropriate source, and outputs the internal clock signal for the microprocessor; control logic circuitry for processing and inputting stop signals to the clock multiplier; and a clock special purpose register, which provides control signals to the control logic circuitry to determine when stopping of the internal clock signal should occur.

18 Claims, 5 Drawing Sheets

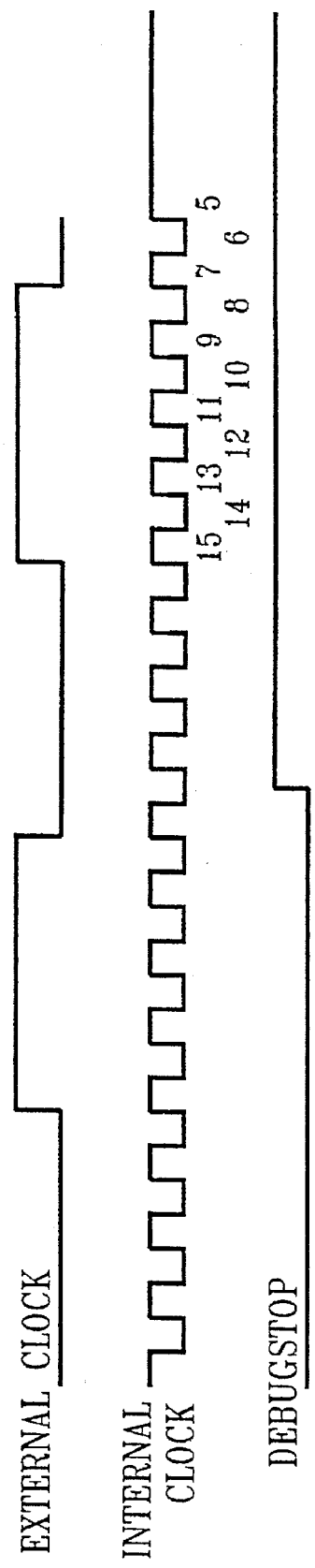
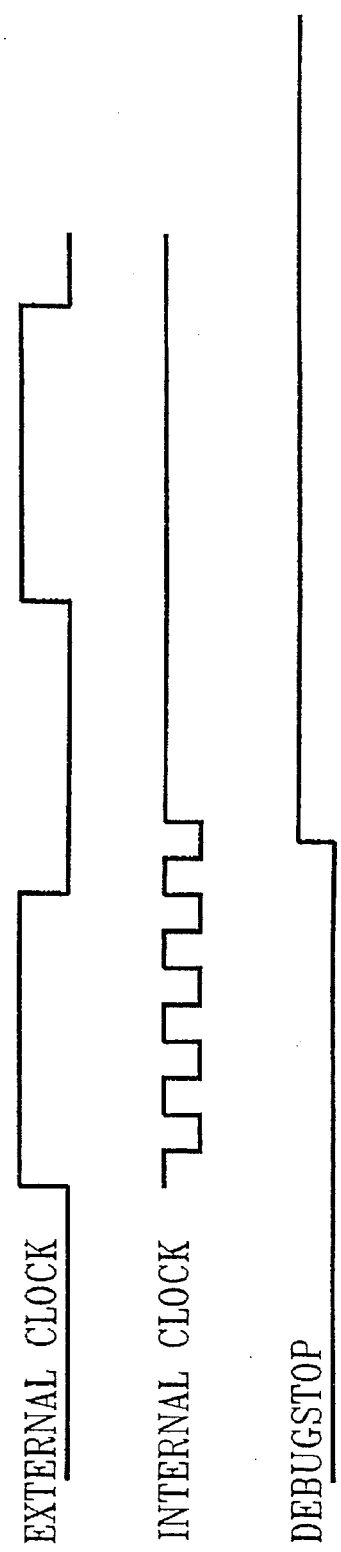

PRECISE STOPPING OF A HIGH SPEED MICROPROCESSOR CLOCK

BACKGROUND OF THE INVENTION

1. Field of the Invention

The present invention relates to microprocessors and more particularly to a method and means for precisely controlling the stopping of a microprocessor's internal clock for functions such as debugging.

2. Problem to be Solved

In microprocessor functioning, it is desirable to be able stop the microprocessor clock at a given point for such purposes, for instance, as during hardware debugging. One method of doing this is to stop the external clock which supplies the clock pulses that enter the microprocessor chip. However, since current microprocessors can operate at much higher internal clock frequencies than the external clock, there is a need to be able to stop the microprocessor internal clock at a much finer granularity.

3. Objects

It is accordingly an object of the present invention to provide a method and means for precisely controlling the stopping of a microprocessor's internal clock.

It is a further object of the invention to provide a method and means for stopping an internal microprocessor clock on any selected phase.

SUMMARY OF THE INVENTION

The present invention is directed to providing a technique and mechanism for selectively stopping the internal clock of a microprocessor. Since the internal clock frequency can be a multiple of the external clock frequency, e.g., as much as 8×, and since there are 2 phases per period, there are up to 16 different phases of the internal clock for every external period. The invention enables the stopping of the internal clock on any of these 16 phases by means of functional components which include: a clock multiplier circuit that receives a clock signal input, from an external oscillator or other appropriate source, and outputs the internal clock signal for the microprocessor; control logic circuitry for processing and inputting stop signals to the clock multiplier; and a clock special purpose register, which provides control signals to the control logic circuitry to determine when stopping of the internal clock signal should occur.

BRIEF DESCRIPTION OF THE DRAWING FIGURES

FIG. 5 illustrates the relationship of the external clock signal, the internal clock signal, and a stop signal in accordance with an example of the present invention wherein the stopping of the internal clock is to occur at a selected phase.

FIG. 6 illustrates the relationship of the external clock signal, the internal clock signal, and a stop signal in accordance with an example of the present invention wherein the stopping of the internal clock is to occur immediately.

DETAILED DESCRIPTION OF THE INVENTION

Figure 1:
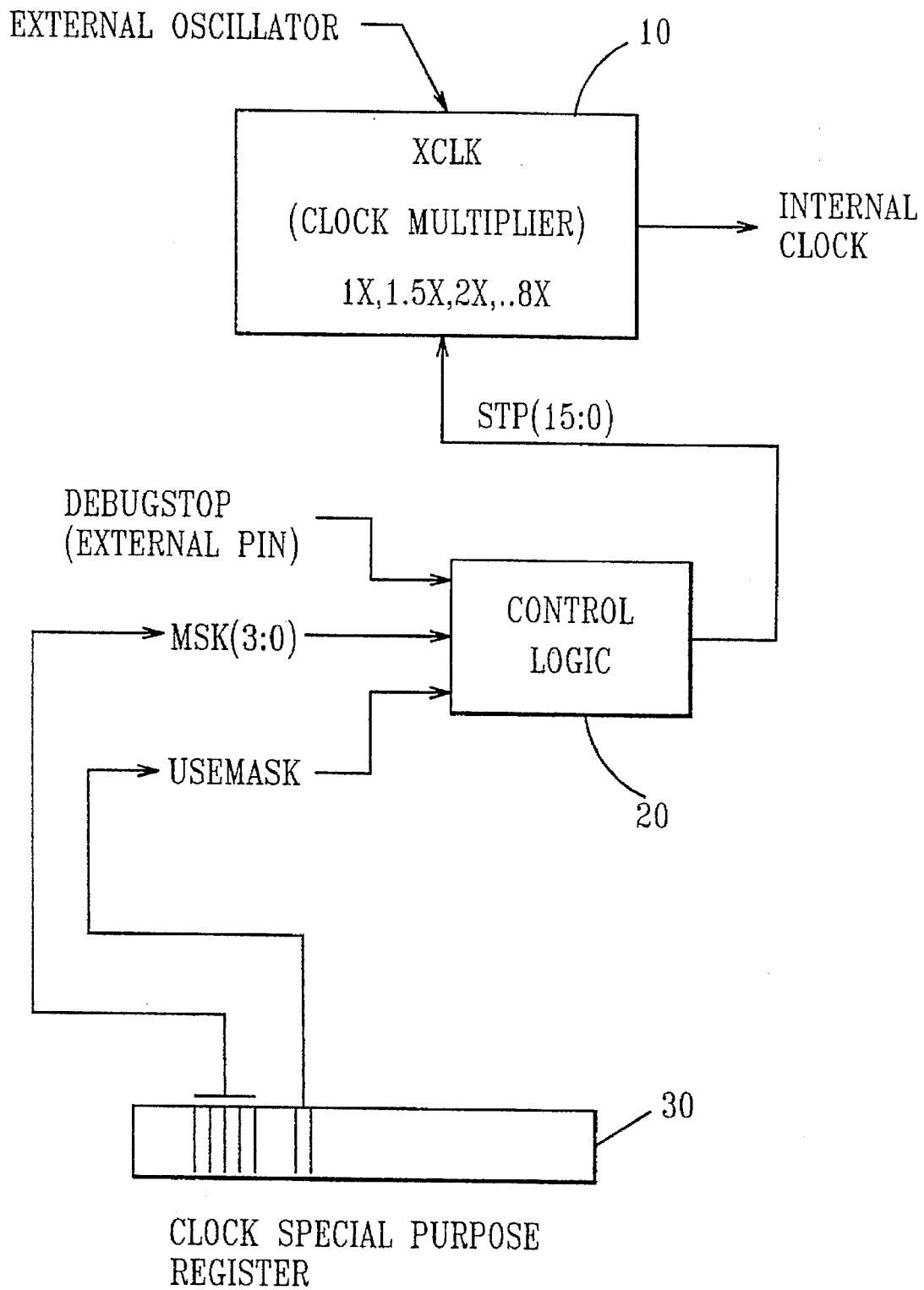
FIG. 1 is block diagram of a stop-clock mechanism for a microprocessor in accordance with the present invention.

A block diagram of a stop-clock mechanism for stopping the internal clock of a microprocessor in accordance with the invention is shown in FIG. 1. The principal components include: a clock multiplier 10, which receives a clock signal input from an external oscillator or other appropriate source, and outputs the internal clock signal for the microprocessor; control logic 20 for processing and inputting stop signals to the clock multiplier 10; and a clock special purpose register 30, which provides control signals to the control logic 20 to determine when stopping of the internal clock signal should occur. Details of preferred embodiments of a clock multiplier 10 and appropriate control logic 20 are shown respectively in FIGS. 2 and 4.

Figure 2:
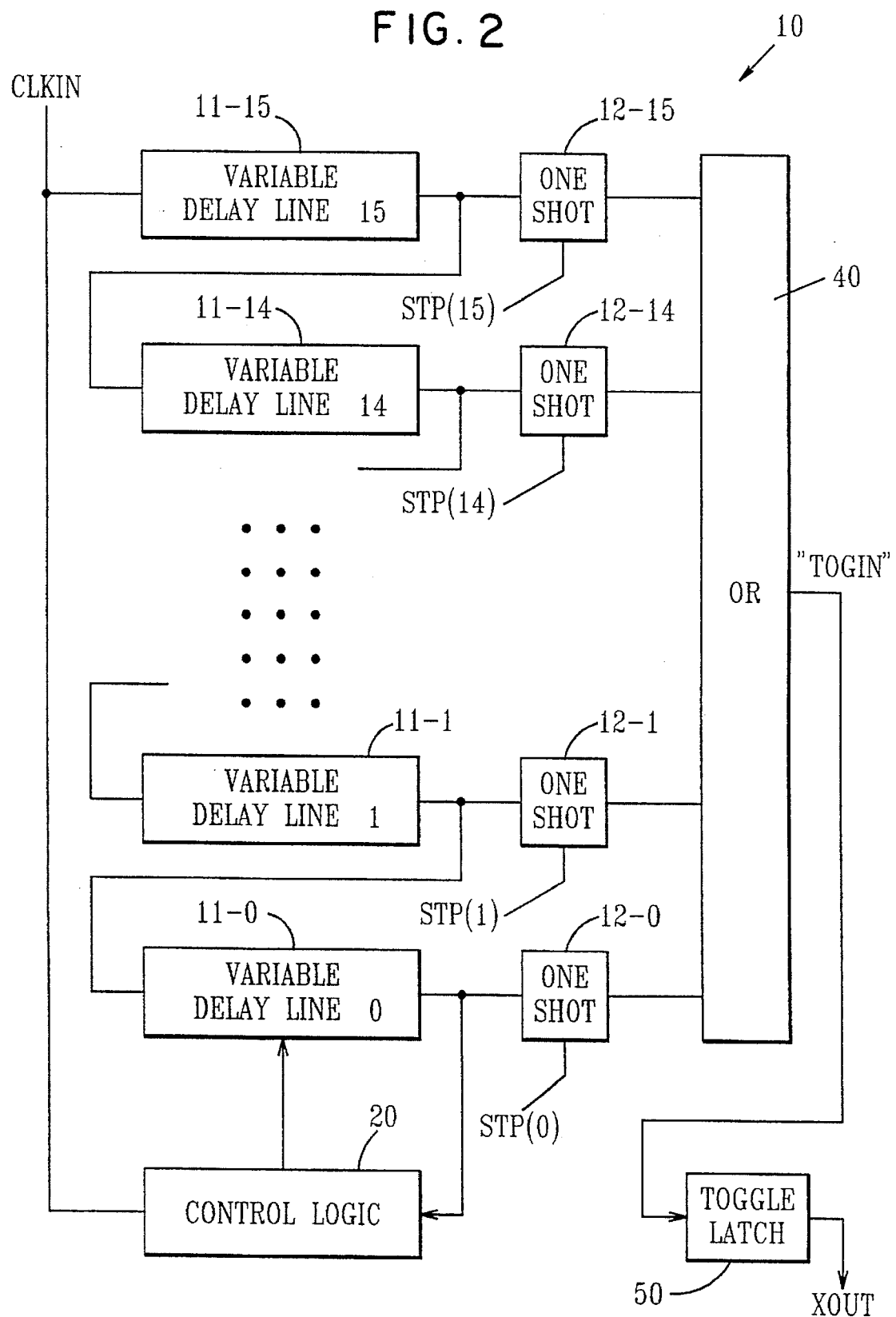
FIG. 2 is a block diagram illustrating functional elements for implementing the concept of the clock multiplier component of the stop-clock mechanism of FIG. 1.

As seen in FIG. 2, the clock multiplier 10 may take the form of a digital delay line circuit which receives the external oscillator or clock input signal CLKIN and produces the internal clock signal XOUT. The multiplication factor between the input and output signals can be varied over a range, such as by 1×, 1.5×, 2× . . . 8×, using appropriate logic circuitry as will be well known to those of skill in the art and thus is not shown here. The clock multiplier circuit contains an array of sixteen (16) delay lines 11 (0–15 or 15:0), each of which line 11 can cause the internal clock to toggle by means of a signal that is output to an OR gate 40 and toggle latch 50 through a respectively coupled one-shot device 12.

A delay line control circuit 20a samples the output of delay line 11-0 and references it to the CLKIN signal in order to adjust the delay lines so that they align with the CLKIN period(s). Each delay line 11 is composed of an even number of inverters in series. The lines are dynamically adjusted by selecting the number of inverters in the path. This selection is performed by the delay line control 20a. Each delay line output signal initiates a Phase by triggering a one shot pulse. However, when the output signals of these delay lines are blocked, the internal clock does not toggle and thus stops. Appropriate control signals for blocking the delay lines are input to the respective one-shot devices 12 by the control logic 20 and are indicated as stop signals STP (15:0).

Figure 3:
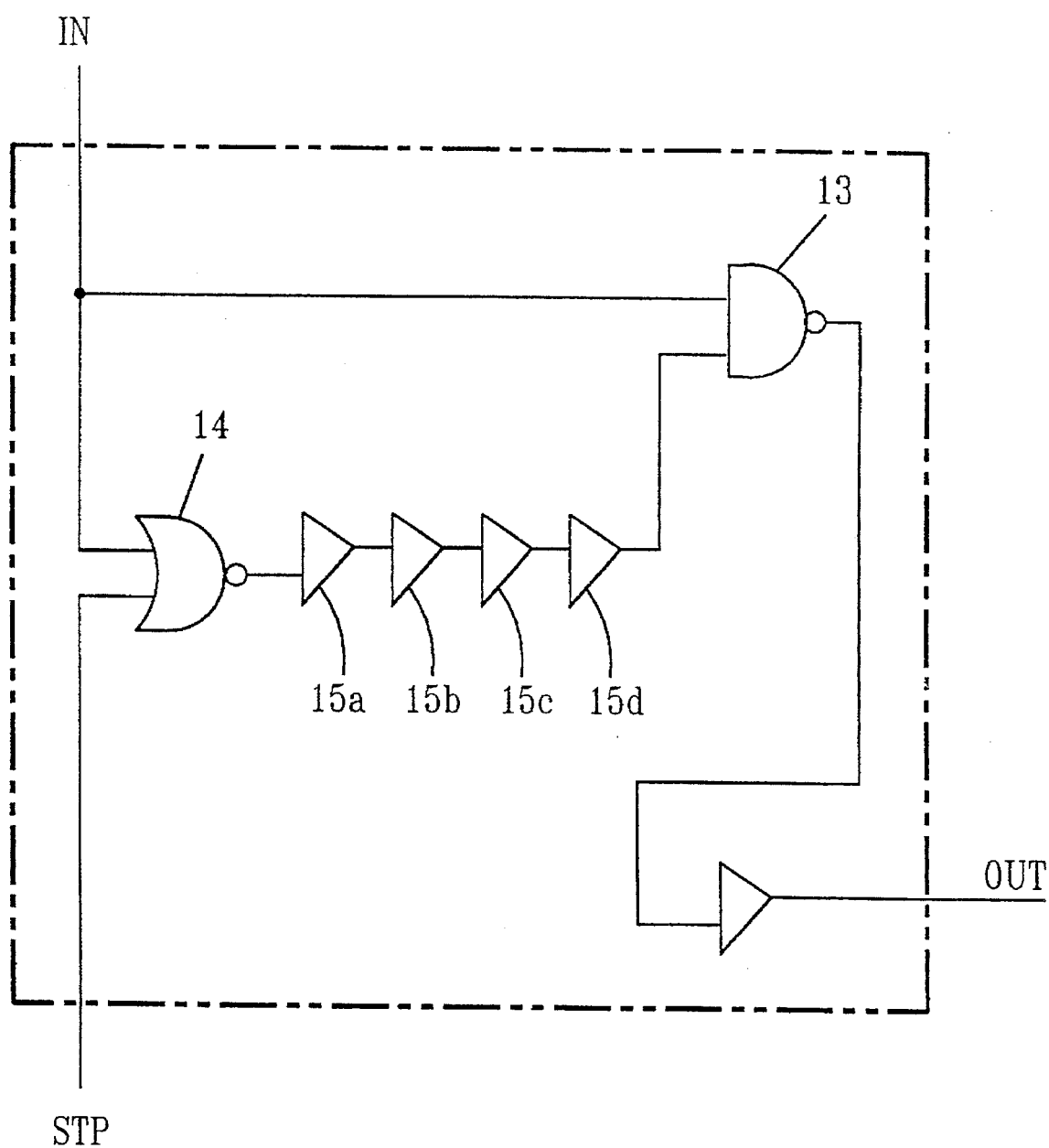
FIG. 3 is a schematic diagram of exemplary circuitry for the one-shot devices shown in FIG. 2.

An example of appropriate circuitry for implementing the one-shot devices 12 is shown in FIG. 3. The one shot (or pulse generation) function is produced by Boolean "AND-ing" an IN signal, from a delay line 11, and an inverted, delayed version of that IN signal. The AND-ing is implemented with a NAND gate 13 and an inverter device (14,15). The inverted delay is produced by the inverter device which includes a NOR gate 14 and four inverters 15a, 15b, 15c, and 15d. This device functions such that whenever the IN signal goes from LOW to HIGH, there is a short period of time before the delayed, inverted version goes from HIGH to LOW, i.e., the time it takes to propagate through the NOR 14 and the four inverters 15. During that short period of time when both inputs to the NAND gate 13 are HIGH, the output OUT of the one shot 12 is HIGH. The STP signals, input from the control logic 20 to NOR 14, are normally LOW, and thus the NOR gate 14 in each one shot 12 acts as an inverter in the formation of the inverted delayed version of the IN signal. However, whenever the STP signal is HIGH, the NOR 14 goes LOW, which condition holds the output of the NAND 13 (and hence the one shot) LOW, regardless of the state of the IN signal so that in effect no output signal OUT results.

Figure 4:
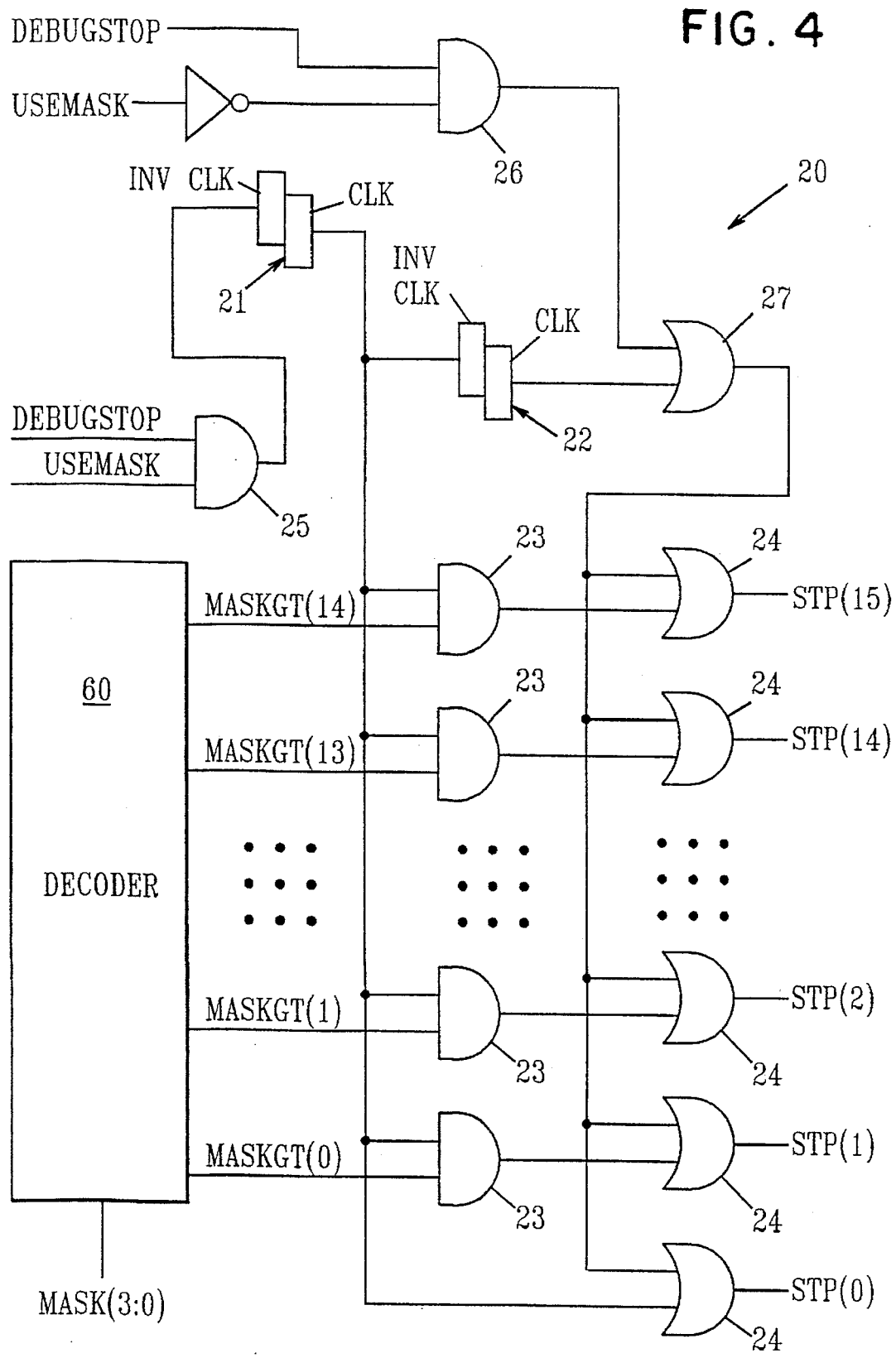
FIG. 4 is a block diagram of circuit elements for implementing the control logic component of the stop-clock mechanism of FIG. 1.

The STP signals may be produced by control logic 20 circuitry such as shown in FIG. 4. This circuitry includes a decoder 60 which receives MASK bit inputs from the clock special purpose register 30 (FIG. 1) and outputs fifteen (15) mask-greater-than (MASKGT) bits that are AND'd and OR'd with appropriate control signals in arrays of AND gates 23 and OR gates 24, respectively, in producing the STP signals. The control signals consist of DEBUGSTOP, coupled through an external pin, that causes some of the STP signals to be asserted, and of a USEMASK signal received from the clock special register 30. The particular STP signals that are asserted are dependent on signal bits in the register 30, which bits are the USEMASK and MASK(3:0) signals and will be described more fully below. When the USEMASK signal is not asserted, there is no output from AND gate 25 or AND gates 23 so that the MASK(3:0) bits are ignored. At the same time an assertion of DEBUGSTOP, with the inverted USEMASK signal, produces an output from AND gate 26 and OR gates 27 and 24 causing all sixteen STP signals to be immediately asserted. If, on the other hand, USEMASK is asserted, an assertion of DEBUGSTOP produces an output from gate 25, rather than gate 26, which output is latched by a first latch 21 with the external clock (CLKIN and INVERTED CLKIN), and with the MASKGT (14:0) signals, causes the STP signals to equal the decoded value of the MASK(3:0) bits as explained below. Thus the internal clock is stopped during this external clock cycle at the desired phase. In the next external cycle, the output is latched by the second latch 22 producing an output from OR gate 27 and causing all the STP signals to be asserted so that the internal clock remains stopped.

The operation of clock special register 30 and the stop-clock process of the invention will be described with illustrative examples. Assume that the microprocessor internal clock to be stopped is running in 8×mode, and it is desired to debug a particular set of test patterns, requiring that the clock be stopped on phase 5 within an external clock period. There are 4 MASK bits in the control signal register 30 (FIG. 1) which may be used to specify the phase to stop on. Accordingly, a MASK (3:0)=0101 (meaning phase 5) is set and an appropriate bit signal sent to the control logic 20. An additional bit in register 30, for the USEMASK, is also set, sending a further signal to logic 20 that indicates that the MASK bits should be used, since they do not have to be used, as will be explained below.

The 4 bits of MASK (3:0) get decoded in the control logic 20, by the decoder 60, into 15 bits called mask-greater-than (MASKGT) bits as noted above. These bits are input to the ANDing and ORing arrays (23, 24) along with DEBUGSTOP and USEMASK signals to produce the STP (15:0) output signals. With this arrangement all MASKGT bits with an index less than the mask value get asserted. For instance, if MASK (3:0)=1110, i.e., 14, then MASKGT (14:0)= 011111111111111. In the present example, MASK (3:0)= 0101, i.e., 5, so MASKGT (14:0)=000000000011111.

Now, when it is desired to initiate the stopping operation, in the external clock period before it is desired to stop, the DEBUGSTOP pin is asserted (see FIG. 5). This request gets latched as indicated above, and then gets AND'd with the MASKGT bits in gates 23 and OR'd in gates 24 to create the appropriate STP (15:0) signals to control the one-shot devices 12 in the clock multiplier 10. Thus, in the period after DEBUGSTOP is asserted, the STP signals are asserted and provided to the clock multiplier 10 to control the clock toggling signals. The clock will continue to toggle until the STP(5) signal is reached whereupon the internal clock is stopped on phase 6 as shown in FIG. 5.

When DEBUGSTOP is de-asserted, the STP signals will be de-asserted, and thus the internal clock will begin toggling again. If DEBUGSTOP was latched with USEMASK, the clock will start with a "Phase 0".

In a second example, assume that it is necessary to stop the clock immediately, but that the phase at which the clock is is not known or important. Then, USEMASK=0 is set, sending a signal to the control logic 20 that indicates that the MASK(3:0) bits from the control signal register 30 should be ignored. When the DEBUGSTOP pin is asserted at the desired point, as explained above, all of the STP (15:0) signals will be caused to be asserted. The clock toggle signals will cease and the internal clock will stop immediately as shown in FIG. 6.

In either example, the contents of the microprocessor chip would likely be scanned out after the internal clock stopped. If the internal clock were allowed to continue for even a few phases, it would be difficult to find the root cause of a problem. With this mechanism for stopping on a specified phase, the state of the microprocessor is observed at the desired point, and hardware debug is made easier. Similarly, when it is desired to stop the internal clock immediately for any reason, this function is also available.

What is claimed is:

1. Apparatus for precisely controlling the stopping of a microprocessor internal multiphase clock, comprising:

means for receiving an external clock signal and deriving an internal clock signal therefrom with a frequency that is a multiple of the frequency of said external clock signal and with each cycle of said external clock signal being divided into a plurality of phases; and means for selectively stopping said internal clock on each of said phases.

2. Apparatus as in claim 1 wherein said selective stopping means comprises:

control logic means for providing stop signals to said deriving means for stopping said internal clock; and means for providing phase indicating signals to said control logic means for controlling the timing of the provision of a stop signal to stop said internal clock at a desired internal clock phase.

3. Apparatus as in claim 2 wherein said phase indicating signal providing means comprises:

a register;

bit mask means for controlling the bit output from said register, said bit output containing bits for selecting the phase for which a stop signal will be provided and a bit for indicating whether said selecting bits should be used; and means for providing said bit output to said control logic means.

4. Apparatus as in claim 3 wherein said control logic means comprises:

means for receiving said bit output and producing a plurality of signals corresponding in number to one less than said phases to be selected and indicative of the phase at which the stop signal is selected to be provided.

5. Apparatus as in claim 4 wherein said control logic means further comprises:

means for receiving said plurality of phase indicative signals and producing a stop signal in accordance with the phase for which the stop signal is selected to be provided.

6. Apparatus as in claim 5 wherein said control logic means further comprises:

means for blocking said phase indicative signals from being input to said receiving and stop signal producing means.

7. Apparatus as in claim 6 wherein said blocking means comprises means responsive to said bit for indicating whether said selecting bits should be used.

8. Apparatus as in claim 5 wherein said clock multiplier means comprises:

means for controlling the toggling of said internal clock signal; means, responsive to the input signal from said external clock, for dividing said input signal into a series of time delay signals corresponding in number to said plurality of phase signals;

means for coupling said time delay signals to said toggling controlling means; and means for receiving said stop signal from said stop signal producing means and controlling the coupling of said time delay signals to said toggling controlling means to stop the toggling of said internal clock signal at the phase for which the stop signal is selected to be provided.

9. Apparatus as in claim 8 wherein said means for receiving said stop signal from said stop signal producing means and controlling the coupling of said time delay signals to said toggling controlling means comprises:

a plurality of one shot devices corresponding in number to said plurality of phase signals.

10. A method for precisely controlling the stopping of a microprocessor internal multiphase clock, comprising the steps of:

receiving an external clock signal and deriving an internal clock signal from said external clock signal, said internal clock signal's frequency being a multiple of the frequency of said external clock signal and each cycle of said external clock signal being divided into a plurality of phases; and selectively stopping said internal clock on each of said phases.

11. The method of claim 10 wherein said selective stopping step comprises:

using control logic and providing stop signals for stopping said internal clock; and providing phase indicating signals for controlling the timing of the provision of a stop signal to stop said internal clock at a desired internal clock phase.

12. The method of claim 11 wherein said phase indicating signal providing step comprises:

providing a register;

using a bit mask and providing bits to said register, containing bits for selecting the phase for which a stop signal will be provided and a bit for indicating whether said selecting bits should be used; and controlling the bit output from said register and providing it to said control logic.

13. The method as in claim 12 wherein said control logic is used to perform the steps comprising:

receiving said bit output and producing a plurality of signals corresponding in number to said phases to be selected and indicative of the phase at which the stop signal is selected to be provided.

14. The method of claim 13 wherein said control logic is used to perform the further steps comprising:

receiving said plurality of phase signals and producing a stop signal in accordance with the phase for which the stop signal is selected to be provided.

15. The method of claim 14 wherein said internal clock frequency is produced by toggling and comprising the further steps of:

in response to the input signal from said external clock, dividing said input signal into a series of time delay signals corresponding in number to said plurality of phase signals; and coupling said time delay signals and said stop signal and controlling the coupling to stop the toggling of said internal clock signal at the phase for which the stop signal is selected to be provided.

16. The method of claim 15 wherein said controlling of the coupling step is carried out by a plurality of one shot devices corresponding in number to said plurality of phase signals.

17. The method of claim 14 wherein said control logic is used to form the further step of selectively blocking said phase indicative signals from being received to produce said stop signals.

18. The method of claim 17 wherein said blocking step is performed in response to the receipt of said bit for indicating whether said selecting bits should be used.

* * * * *